(12) United States Patent
Marpe et al.

(10) Patent No.: US 9,312,881 B2
(45) Date of Patent: Apr. 12, 2016

(54) BINARY ARITHMETIC CODING SCHEME

(71) Applicant: Fraunhofer-Gesellschaft zur Foerderung der Angewandten Forschung e.V., Munich (DE)

(72) Inventors: Detlev Marpe, Berlin (DE); Heiner Kirchhoffer, Berlin (DE); Mischa Siekmann, Berlin (DE); Christian Bartnik, Berlin (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 66 days.

(21) Appl. No.: 14/446,977

(22) Filed: Jul. 30, 2014

(65) Prior Publication Data

US 2014/0333458 A1 Nov. 13, 2014

Related U.S. Application Data

(63) Continuation of application No. PCT/EP2013/051045, filed on Jan. 21, 2013.

(60) Provisional application No. 61/592,383, filed on Jan. 30, 2012.

(51) Int. Cl.
*H03M 7/00* (2006.01)
*H03M 7/40* (2006.01)
*H04N 19/91* (2014.01)

(52) U.S. Cl.
CPC .......... *H03M 7/4018* (2013.01); *H03M 7/4012* (2013.01); *H03M 7/4081* (2013.01); *H04N 19/91* (2014.11)

(58) Field of Classification Search
CPC .. H04N 19/91; H03M 7/4018; H03M 7/4081; H03M 7/4012
USPC .......................................................... 341/107
See application file for complete search history.

(56) References Cited

U.S. PATENT DOCUMENTS

| | | | |
|---|---|---|---|
| 8,482,440 B2* | 7/2013 | Lee et al. | 341/107 |
| 8,604,951 B2* | 12/2013 | Sze et al. | 341/107 |
| 8,666,179 B2 | 3/2014 | Suzuki et al. | |
| 8,711,019 B1* | 4/2014 | Su et al. | 341/107 |
| 8,718,146 B2* | 5/2014 | Kim et al. | 375/240.23 |
| 2004/0114682 A1 | 6/2004 | Iler | |

(Continued)

FOREIGN PATENT DOCUMENTS

| | | |
|---|---|---|
| EP | 0510627 | 10/1992 |
| JP | 2005525018 A | 8/2005 |
| JP | 2010251956 A | 11/2010 |

(Continued)

OTHER PUBLICATIONS

Feygin, Gennady et al., "Architectural Advances in the VLSI Implementation of Arithmetic Coding for Binary Image Compression", Canada (1994), 10 pages.

(Continued)

*Primary Examiner* — Brian Young
(74) *Attorney, Agent, or Firm* — Michael A. Glenn; Perkins Coie LLP

(57) ABSTRACT

A binary arithmetic coding scheme is extended by a functionality to encode and decode non-negative integer values with particular low computational complexity.

36 Claims, 2 Drawing Sheets

(56) References Cited

U.S. PATENT DOCUMENTS

2004/0117714 A1 6/2004 Marpe et al.
2009/0079602 A1 3/2009 Sze et al.

FOREIGN PATENT DOCUMENTS

WO 2007102518 A1 9/2007
WO WO-2010-0119757 10/2010

OTHER PUBLICATIONS

Wang, Ronggang et al., "International Organisation for Standardisation Organisation Internationale De Normalisation ISO/IEC JTC1/SC29/WG11 Coding of Moving Pictures and Audio", China (2012), 26 pages.

* cited by examiner

BINARY ARITHMETIC CODING SCHEME

CROSS-REFERENCE TO RELATED APPLICATIONS

This application is a continuation of copending International Application No. PCT/EP2013/051045, filed Jan. 21, 2013, which is incorporated herein by reference in its entirety, and additionally claims priority from U.S. Provisional Application No. 61/592,383, filed Jan. 30, 2012, which is also incorporated herein by reference in its entirety.

BACKGROUND OF THE INVENTION

The present application is concerned with binary arithmetic coding such as used, for example, in coding transform coefficient levels.

An example for an arithmetic coding scheme is CABAC as used in H.264.

SUMMARY

An embodiment may have a binary arithmetic decoder for decoding a non-negative integer value from a bitstream, the binary arithmetic decoder being configured to use a binary unary representation of the non-negative integer value, which maps the non-negative integer value c onto a binary symbol sequence comprising a number of MPS's equal to the non-negative integer value, a current state of the binary arithmetic decoder being defined by a current interval defined by an interval width R, and a value V from the interior of the current interval, the binary arithmetic decoder being configured to decode the number of MPS's of the non-negative integer value iteratively using an iteration comprising determining a maximum number $c_{max}$ of MPS that can be decoded until an LPS occurs with using $2^s$ as a partial interval width $R_{LPS}$ corresponding to an LPS, by measuring a difference of R and V with $2^s$; determining a maximum number $c_{mps}$ of MPS that can be decoded until a renormalization occurs with using $2^s$ as the partial interval width $R_{LPS}$ corresponding to the LPS, by measuring a difference of R and $R_{min}$ with $2^s$, with $R_{min}$ denoting a minimum allowed value for R and being a power of 2; if $c_{max}$ is greater zero and $c_{max}$ is greater than $c_{mps}$, reducing R by $c_{mps}$ times $2^s$, thereby decoding $c_{mps}$ of the MPS's of c; performing a renormalization by including increasing R using a renormalization factor being a predetermined power of 2, reading a bit from the bitstream, and increasing V using the renormalization factor and subsequently adding the value of bit; if $c_{max}$ is greater zero and $c_{max}$ is smaller than $c_{mps}$, reducing R by times $2^s$, thereby decoding $c_{max}$ of the MPS's of c, wherein the binary arithmetic decoder is configured such that the binary symbol sequence comprises a number of MPS's equal to the non-negative integer value, followed by an LPS, wherein the binary arithmetic decoder is further configured to decode the LPS of the non-negative integer value by determining a renormalization number based on a difference of log 2($R_{min}$) and s; updating V using a difference of V and a partial interval width $R_{MPS}$ corresponding to an MPS, multiplied with 2 to the power of the renormalization number; reading the renormalization number of bits from the bitstream and adding same to V; setting R to be $R_{min}$ or a predetermined function of $R_{min}$.

Another embodiment may have a binary arithmetic encoder for encoding a non-negative integer value into a bitstream, the binary arithmetic encoder being configured to use a binary unary representation of the non-negative integer value, which maps the non-negative integer value c onto a binary symbol sequence comprising a number of MPS's equal to the non-negative integer value, a current state of the binary arithmetic encoder being defined by a current interval defined by an interval width R and an interval offset L, the binary arithmetic encoder being configured to encode the number of MPS's of the non-negative integer value iteratively using an iteration comprising determining a maximum number $c_{mps}$ of MPS that can be encoded until a renormalization occurs with using $2^s$ as a partial interval width $R_{LPS}$ corresponding to an LPS, by measuring a difference of R and $R_{min}$ with $2^s$, with $R_{min}$ denoting a minimum allowed value for R and being a power of 2; if c is greater than $c_{mps}$, reducing R by $c_{mps}$ times $2^s$, thereby coding $c_{mps}$ of the MPS's of c; performing a renormalization by including increasing R and L using a renormalization factor being a predetermined power of 2, respectively, and writing a bit to the bitstream; if c is smaller than reducing R by c times $2^s$, thereby coding all c MPS's of c, wherein the binary arithmetic encoder is configured such that the binary symbol sequence comprises a number of MPS's equal to the non-negative integer value, followed by an LPS, wherein the binary arithmetic encoder is further configured to encode the LPS of the non-negative integer value by determining a renormalization number based on a difference of $\log_2(R_{min})$ and s; updating L using a sum of L and a partial interval width $R_{MPS}$ corresponding to an MPS, multiplied with 2 to the power of the renormalization number; writing the renormalization number of bits to the bitstream; setting R to be $R_{min}$ or a predetermined function of $R_{min}$.

Another embodiment may have a method for binary arithmetic decoding a non-negative integer value from a bitstream, the method using a binary unary representation of the non-negative integer value, which maps the non-negative integer value c onto a binary symbol sequence comprising a number of MPS's equal to the non-negative integer value, a current state of the method being defined by a current interval defined by an interval width R, and a value V from the interior of the current interval, the method comprising decoding the number of MPS's of the non-negative integer value iteratively using an iteration comprising determining a maximum number $c_{max}$ of MPS that can be decoded until an LPS occurs with using $2^s$ as a partial interval width $R_{LPS}$ corresponding to an LPS, by measuring a difference of R and V with $2^s$; determining a maximum number $c_{mps}$ of MPS that can be decoded until a renormalization occurs with using $2^s$ as the partial interval width $R_{LPS}$ corresponding to the LPS, by measuring a difference of R and $R_{min}$ with $2^s$, with $R_{min}$ denoting a minimum allowed value for R and being a power of 2; if $c_{max}$ is greater zero and $c_{max}$ is greater than $c_{mps}$, reducing R by $c_{mps}$ times $2^s$, thereby decoding $c_{mps}$ of the MPS's of c; performing a renormalization by including increasing R using a renormalization factor being a predetermined power of 2, reading a bit from the bitstream, and increasing V using the renormalization factor and subsequently adding the value of bit; if $c_{max}$ is greater zero and $c_{max}$ is smaller than $c_{mps}$ reducing R by $c_{max}$ times $2^s$, thereby decoding $c_{max}$ of the MPS's of c, wherein the binary symbol sequence comprises a number of MPS's equal to the non-negative integer value, followed by an LPS, wherein the method further comprises decoding the LPS of the non-negative integer value by determining a renormalization number based on a difference of log 2($R_{min}$) and s; updating V using a difference of V and a partial interval width $R_{MPS}$ corresponding to an MPS, multiplied with 2 to the power of the renormalization number; reading the renormalization number of bits from the bitstream and adding same to V; setting R to be $R_{min}$ or a predetermined function of $R_{min}$.

Another embodiment may have a method for binary arithmetic encoding a non-negative integer value into a bitstream, the method using a binary unary representation of the non-negative integer value, which maps the non-negative integer value c onto a binary symbol sequence comprising a number of MPS's equal to the non-negative integer value, a current state of the method being defined by a current interval defined by an interval width R and an interval offset L, the method comprising encoding the number of MPS's of the non-negative integer value iteratively using an iteration comprising determining a maximum number $c_{mps}$ of MPS that can be encoded until a renormalization occurs with using $2^s$ as a partial interval width $R_{LPS}$ corresponding to an LPS, by measuring a difference of R and $R_{min}$ with $2^s$, with $R_{min}$ denoting a minimum allowed value for R and being a power of 2; if c is greater than $c_{mps}$, reducing R by $c_{mps}$ times $2^s$, thereby coding $c_{mps}$ of the MPS's of c; performing a renormalization by including increasing R and L using a renormalization factor being a predetermined power of 2, respectively, and writing a bit to the bitstream; if c is smaller than $c_{mps}$, reducing R by c times $2^s$, thereby coding all c MPS's of c, wherein the binary symbol sequence comprises a number of MPS's equal to the non-negative integer value, followed by an LPS, wherein the method further comprises encoding the LPS of the non-negative integer value by determining a renormalization number based on a difference of $\log_2(R_{min})$ and s; updating L using a sum of L and a partial interval width $R_{MPS}$ corresponding to an MPS, multiplied with 2 to the power of the renormalization number; writing the renormalization number of bits to the bitstream; setting R to be $R_{min}$ or a predetermined function of $R_{min}$.

Another embodiment may have a computer program having a program code for performing, when running on a computer, the above methods for binary arithmetic decoding and encoding.

Another embodiment may have a computer readable medium having stored thereon a computer program having a program code for performing, when running on a computer, the above methods for binary arithmetic decoding and encoding.

BRIEF DESCRIPTION OF THE DRAWINGS

Embodiments of the present invention will be described below with respect to the drawings among which.

DETAILED DESCRIPTION OF THE INVENTION

Figure 1:
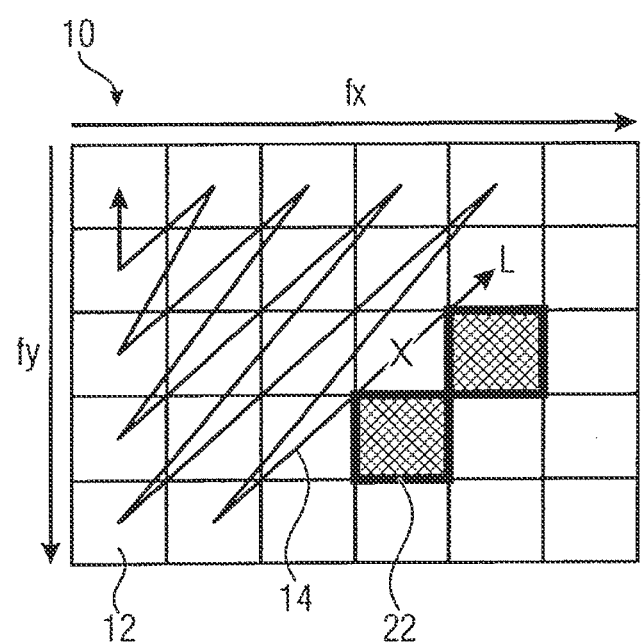
FIG. 1 shows an example for block of transform coefficients and a scan order defined thereamong.

In the following binary arithmetic coding scheme, a conventional state-of-the-art table-based binary arithmetic encoding and decoding scheme is extended by a functionality to encode and decode non-negative integers with particular low computational complexity. It uses the technique of processing multiple MPS's within a single renormalization cycle of a binary arithmetic encoding and decoding engine in combination with a unary binarization of the non-negative integer values. The ability to encode and decode conventional bins is preserved and can be arbitrarily interleaved with the encoding and decoding of non-negative integers using the new algorithm as described in the following embodiments. Furthermore, resulting code lengths for the non-negative integers can be configured to be similar to the ones of Exponential-Golomb codes or Golomb-Rice codes or combinations of both.

In order to understand the principles and advantages of the coding scheme and its embodiments outlined below, imagine a table-based binary arithmetic encoder/decoder pair of the following type. The mapping from the representative LPS/LPB probability $p_{LPS}$ of a given bin to a corresponding code interval width $R_{LPS}$—i.e. the interval subdivision of the internal state of the binary arithmetic coding engine, which is defined by the current interval width R and the current interval offset L, identifying, for example, the lower bound of the code interval—is realized by using a table look-up. Imagine, for the table-based binary arithmetic coding engine, K representative interval width values $\{Q_0, \ldots, Q_{K-1}\}$ were used for representing R and S representative probability values $\{P_0, \ldots, P_{S-1}\}$ were used for representing the probability estimate p an LPS can be associated with. Thus, arithmetic encoding and decoding of a bin may involve the substeps of mapping the current interval width R to a quantization index q with values in $\{0, \ldots, K-1\}$ and performing the interval subdivision by accessing product values for a product of the corresponding partial interval width value $Q_q$ times the probability estimate $P_{p\_state}$ for the LPS associated with the current bin from a lookup table Rtab with using q and p_state as indexes.

The binary arithmetic encoding engine could perform the following steps in coding a bin:
1. Receiving valLPS, p_state, and the bin.
2. Quantization of R:
   q_index=Qtab[R>>q] (or some other form of quantization; K quantization levels are available)
3. Determination of $R_{LPS}$ and $R_{MPS}$:
   $R_{LPS}$=Rtab [p_state][q_index] (note that Rtab has stored pre-calculated values for p [p_state]·Q [q_index])
   $R_{MPS}$=R−$R_{LPS}$ (That is, the encoder divides the interval into two portions)
4. Calculation of the new partial interval:

--- if (bin = 1 − valMPS) then {
    L ← L + $R_{MPS}$ (That is, the lower portion of the current interval R immediately extending from L is associated with MPS)
    R ← $R_{LPS}$}
else
    R ← $R_{MPS}$

---

5. Renormalization of L and R, writing bits,

--- while (R < $R_{min}$) {
    R ← R << 1
    L ← L << 1
    Write one bit to the bitstream }

--- wherein
q_index describes the index of a quantization value read out of Qtab,
p_state describes the current state,
$R_{LPS}$ describes the interval width corresponding to the LPS and
$R_{MPS}$ describes the interval width corresponding to the MPS and
$R_{min}$ describes the minimum allowed value for R,
valMPS describes the value of the bit corresponding to the MPS.

Accordingly, the binary arithmetic decoding engine could perform the following steps in decoding a bin:
1. Receiving valLPS, p_state, and the request for a bin
2. Quantization of R:
q_index=Qtab[R>>q] (or some other form of quantization)
3. Determination of $R_{LPS}$ and $R_{MPS}$:
$R_{LPS}$=Rtab [p_state][q_index] (note that Rtab has stored pre-calculated values for p [p_state]·Q [q_index])
$R_{MPS}$=R-$R_{LPS}$
4. Determination of bin depending on the position of the partial interval:

```
if (V ≥ R_MPS) then {
    bin ← 1 - valMPS (bin is decoded as LPS)
    V ← V - R_MPS
    R ← R_LPS}
else {
    bin ← valMPS (bin is decoded as MPS)
    R ← R_MPS}
```

5. Renormalization of R, reading out one bit and updating V,

```
while (R < R_min) {
    R ← R << 1
    bit ← read one bit from bitsream
    V ← (V << 1) + bit }
``` wherein
q_index describes the index of a quantization value read out of Qtab,
p_state describes the current state,
$R_{LPS}$ describes the interval width corresponding to the LPS,
$R_{MPS}$ describes the interval width corresponding to the MPS,
$R_{min}$ describes the minimum allowed value for R,
valMPS describes the value of the bit corresponding to the MPS, and
V describes a value from the interior of the current partial interval.

In the following, an extension to the above binary arithmetic encode/decoder pair is described that allows for the encoding and decoding of non-negative integer values. To accomplish this, a unary representation of the non-negative integer value is formed consisting of a number of MPS's equal to the non-negative integer value followed by one LPS. For the encoding and decoding of the non-negative integer, two to the power of s is selected as initial $R_{LPS}$ according to the distribution of the non-negative integer values instead of deriving it during the encoding and decoding process and in order to allow for multi-MPS encoding and decoding. During the encoding and decoding process, this parameter is updated according to a predefined rule whenever a renormalization cycle is carried out. This predefined rule can be a simple decrement of s by 1 carried out for the first time after the $u_{th}$ renormalization cycle since the beginning of the coding process of the current integer value and then carried out at each further renomrmalization until it achieves a predefined minimum value $s_{min}$.

A binary arithmetic encoding engine could perform the following steps to encode a non-negative integer value:
1. Receiving a non-negative integer value c to be encoded and the associated parameter s, used to derive $R_{LPS}$ ($R_{LPS}$ is not explicitly used, but only implicitly)
2. Initialize a renormalization count for the current integer value to zero:
$n_{renorm}$←0
3. Determination of the number of MPS's before renormalization $c_{mps}$:
$c_{mps}$←1+((R-$R_{min}$)>>s)
4. Loop until all MPS's are encoded:

```
if (c >= c_mps) then {
    R ← R - (c_mps << s)
    R ← R << 1
    L ← L << 1
    Write one bit to the bitstream
    if(n_renorm >= u && s > s_min) then {
        s ← s - 1 }
    c ← c - c_mps
    n_renorm = n_renorm + 1
    Continue with step 3. }
else
    R ← R - (c << s)
    c = 0
```

5. Encoding of terminating LPS and final renormalization of L and R, writing bits:
numRenorm=log 2($R_{min}$)-s
L←(L+R-(1<<s))<<numRenorm
R←$R_{min}$
Write "numRenorm" bits to the bitstream
wherein
c describes the integer value to be encoded
$c_{mps}$ describes the number of mps that can be encoded until a renormalization cycle is necessitated
$R_{min}$ describes the minimum allowed value for R (a power of 2), In step 4, the maximum number of mps until renormalization $C_{mps}$ is compared to the value c to be encoded. If c is smaller than $c_{mps}$, this indicates that all mps can be encoded without triggering a renormalization cycle afterwards. Otherwise (c is greater or equal to $c_{mps}$), exactly $C_{mps}$ mps can be encoded before a renormalization is necessitated. After this renormalization is applied, c is reduced by $C_{mps}$ and the procedure continues at step 3. After all mps are encoded with this procedure, step 5 is applied which corresponds to encoding one LPS. The renormalization is less complex than in the case where $R_{LPS}$ can take arbitrary values. Since $R_{LPS}$ is a power of 2 (and the exponent is available as parameter s without a need to compute it from $R_{LPS}$), the number of renormalization cycles numBits is computed as log 2($R_{MIN}$)-s. Thus, R can be set immediately to $R_{MIN}$ instead of computing it by R←(1<<s)<<(log 2($R_{MIN}$)-s).

Accordingly, a binary arithmetic decoding engine could perform the following steps in decoding a non-negative integer value:
1. Receiving request for decoding a non-negative integer value c and the parameter s, used to derive $R_{LPS}$ ($R_{LPS}$ is not explicitly used, but only implicitly)
2. Initialize the current integer value c to zero:
c←0
3. Initialize a renormalization count for the current integer value to zero:
$n_{renorm}$←0
4. Determination of the number of mps $c_{mps}$ before an LPS occurs:
$c_{max}$=(R-1-V)>>s
5. Determination of the maximum number of mps $c_m$, before a renormalization occurs:
$c_{mps}$=1+((R-$R_{min}$)>>s)

6. Loop until all MPS's are decoded:

```
if(c_max > 0) then {
    if(c_max > c_mps) then {
        R ← R - (c_mps << s )
        R ← R << 1
        bit ← read one bit from the bitsream
        V ← (V << 1) + bit
        c ← c + c_mps
        if(n_renorm >= u && s > s_min) then {
            s ← s - 1 }
        n_renorm = n_renorm + 1
    } else {
        c ← c + c_max
        R ← R - (c_max << s ) }
Continue with step 4. }
```

7. Decode the terminating LPS:
numRenorm=log 2($R_{min}$)-s
V←(V−R+(1<<s))<<numRenorm
bits←read "numRenorm" bits from the bitsream
V←V+bits
R←$R_{min}$
wherein
c describes the integer value to be decoded
$c_{max}$ describes the number of MPS's that can be decoded until an LPS occurs
$c_{mps}$ describes the number of MPS's that can be decoded until a renormalization cycle is necessitated
$R_{min}$ describes the minimum allowed value for R (a power of 2),
V describes a value from the interior of the current partial interval.

In general, a good choice for parameter s turned out to be log 2($R_{min}$) minus k.

Next, an embodiment is described where the final renormalization (the one that follows the terminating LPS) is modified. In the described embodiment, the final renormalization results in setting R to $R_{min}$ (see step 5 in the encoder and step 7 in the decoder). After the next encoded or decoded bin, a renormalization is necessitated in any event since R is reduced at least by 1 (regardless of whether an MPS or LPS occurs). This renormalization can be combined with the previous renormalization using the following inventive step.

Step 5 in the encoder is replaced with:
5. Encoding of terminating LPS and final renormalization of L and R, writing bits:

```
numRenorm = 1 + log2(R_min) - s
L ← (L + R - (1 << s)) << numRenorm
R ← 2 * (R_min - 1)
Write "numRenorm" bits to the bitstream
```

Step 7 in the decoder is replaced with:
7. Decode the terminating LPS:

```
numRenorm = 1 + log2(R_min) - s
V ← (V - R + (1 << s)) << numRenorm
bits ← read "numRenorm" bits from the bitstream
V ← V + bits
R ← 2 * (R_min - 1)
```

This modification increases the number of renormalizations by 1 after the final LPS and afterwards, R is reduced by 2 in order to let it not exceed $R_{max}$ ($R_{max}$ is the maximum value R can take). This reduction of R by 2 corresponds to a slight bit rate overhead (as if an MPS with $R_{LPS}$ equal to 2 was encoded). Advantageously, the artificial increase of the number of renormalization cycles by 1 comes at no extra computational complexity, and is thus saved. I.e., compared to the case without this modification, the renormalization would occur separately and necessitate all the computational steps necessitated for a renormalization.

Next, an embodiment is described where the parameter u is modified prior to executing the encoding or decoding procedure dependent on the value of R. A threshold $R_{thr}$ is defined and used to determine whether u is to be increased by 1 or not. In encoder and decoder, before step 1, the following step is executed:

```
Step 0:  if(R < Rthr) then {
             u ← u + 1}
```

This corresponds to delaying the process of decreasing s by 1 renormalization cycle if R is below the threshold Rthr. Advantagously, it is avoided that for values of R close to Rmin, that s is decreased very early. Imagine, the two extreme cases that R equals Rmin and R equals Rmax at the beginning of the encoding or decoding of a non-negative integer value and u=0. In the case where R equals Rmin, immediately after the first MPS, a renormalization is triggered and s is decreased by 1. This results in encoding all MPS after the first using the s decreased by 1. If R was not equal to Rmax instead of Rmin (by chance), many MPS were encoded before the first renormalization cycle and then s was decreased by 1 for the first time. By using the technique of the present embodiment, the average number of MPS before the first change of s is increased.

Next, an embodiment is described where a maximum value $c_m$ is defined for the non-negative integer. In the case, where c equals $c_m$, the final LPS is not encoded or decoded. This corresponds to a truncated unary representation. In the encoder, step 5 needs to be skipped in the case where the non-negative integer value as originally to be encoded equals $c_m$. In the decoder, step 7 needs to be skipped in the case where c (at the time where step 7 would be entered) equals $c_m$ and furthermore, step 4 is replaced with the following:

4. Determination of the number of mps $c_{max}$ before an LPS occurs:

```
c_max = (R - 1 - V) >> s
if(c + c_max > c_m) then {
    c_max ← c_m - c }
```

In one embodiment, the above embodiments may be used to replace the concatenation of Golomb-Rice code words and Exponential-Golomb code words as used in the current HEVC transform coefficient coding part. In this case, if an absolute transform coefficient level is greater than 2, its value minus 3 is binarized and encoded using the concatenation of a Golomb-Rice code and an Exponential-Golomb code. In the present embodiment, this value minus 3 is encoded using any of the schemes described above. $R_{MIN}$ may be set to 256 in this example. The two parameters, derived for each absolute transform coefficient level greater 2 in HEVC are the Golomb-Rice parameter k and a cutoff value w that determines at what value the Golomb-Rice code word is terminated and an Exponential-Golomb code word is appended. In the current embodiment, the above scheme is used for transform coefficients with k equal 3 only and in this case, s may be set to 5 and $n_{renorm}$ may be set to 0.

In order to illustrate the just-mentioned possibility of using above embodiments in coding transform coefficient levels, i.e. quantization levels of quantized transform coefficients, reference is made to the figures. However, prior to this, it should be noted that above embodiments are also transferable to other kinds of non-signed integer values.

The description brought forward below preliminarily assumes the transform coefficients to be coded as being two-dimensionally arranged so as to form a transform block such as a transform block of a picture. However, as just-mentioned, the present application is not restricted to image and/or video coding. Accordingly, the transform coefficients mentioned below could, alternatively, be transform coefficients of a one-dimensional transform such as used, for example, in audio coding or the like.

Figure 2:
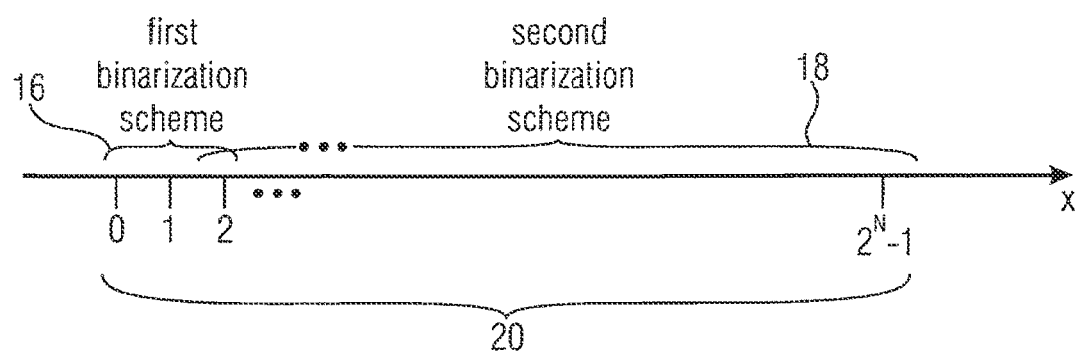
FIG. 2 shows an example for a binarizatino of transform coefficient levels.
Figure 3:
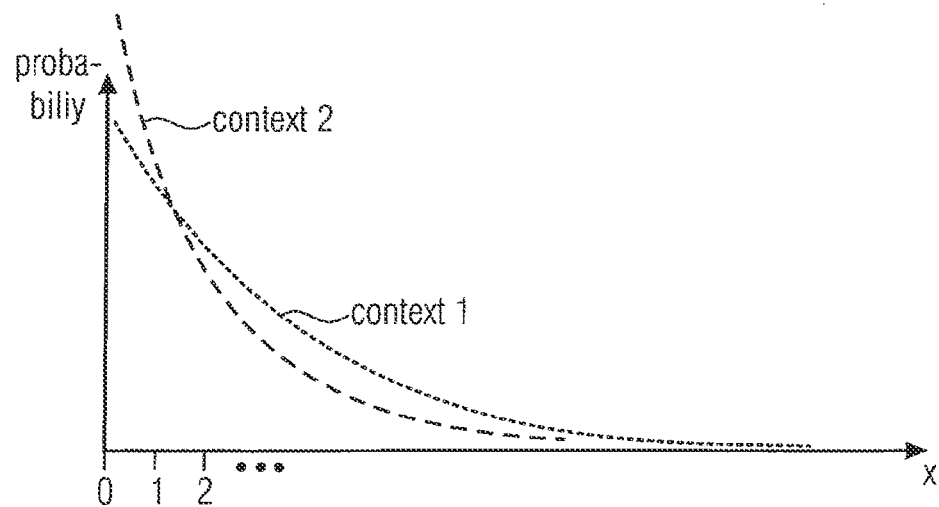
FIG. 3 shows an exemplary graph associating to each possible transform coefficient level x a probability at which the respective transform coefficient level is actually assumed by a transform coefficient in question.

FIGS. 1 to 3 show an example of transform coefficients of a transform block and their way of entropy coding using any of the above-explained embodiments.

FIG. 1 exemplarily shows a block 10 of transform coefficients 12. In the present embodiment, the transform coefficients are two-dimensionally arranged. In particular, same are exemplarily shown as being regularly arranged in columns and rows although another two-dimensional arrangement is also possible. The transform which led to the transform coefficients 12 or transform block 10 may be a DCT or some other transform which decomposes a (transform) block of a picture, for example, or some other block of spatially arranged values into components of different spatial frequency. In the present example of FIG. 1, the transform coefficients 12 are two-dimensionally arranged in columns i and rows j so as to correspond to frequency pairs $(f_x(i), f_y(j))$ of frequencies $f_x(i)$, $f_y(j)$ measured along different spatial directions x,y such as directions perpendicular to each other, where $f_{x/y}(i) < f_{x/y}(i+1)$ and (i,j) is the position of the respective coefficient in transform block 10.

Often the transform coefficients 12 corresponding to lower frequencies have higher transform coefficient levels compared to transform coefficients corresponding to higher frequencies. Accordingly, often many of the transform coefficients near the highest frequency component of the transform block 10 are quantized to zero and may not have to be coded. Accordingly, a scan order 14 may be defined among the transform coefficients 12 which one-dimensionally arranges the two-dimensionally arranged transform coefficients 12 (i,j) into a sequence of coefficients at an order, i.e. (i,j)→k, so that it is likely that the transform coefficient levels have a tendency of monotonically decreasing along this order, i.e. it is likely that coefficient level of coefficient k is greater than coefficient level of coefficient k+1.

For example, a zigzag or a raster scan may be defined among the transform coefficients 12. According to the scan, the block 10 may be scanned in diagonals from, for example, the DC component transform coefficient (upper left-hand coefficient) to the highest frequency transform coefficient (lower right-hand coefficient) or vice versa. Alternatively, a row-wise or column-wise scan of the transform coefficients between the just mentioned extreme component transform coefficients may be used.

As described further below, in coding the transform block the position of the last non-zero transform coefficient L in scan order 14 may be coded into the bitstream first, with then merely coding the transform coefficients from the DC transform coefficient along scan path 14 to the last non-zero transform coefficient L—optionally in that direction or in counter direction.

The transform coefficients 12 have transform coefficient levels which may be signed or unsigned. For example, the transform coefficients 12 may have been obtained by the afore-mentioned transform with subsequent quantization onto a set of possible quantization values each being associated with a respective transform coefficient level. The quantization function used to quantize the transform coefficients, i.e. map the transform coefficients onto the transform coefficient levels, may be linear or non-linear. In other words, each transform coefficient 12 has a transform coefficient level out of an interval of possible levels. FIG. 2, for example, shows an example where the transform coefficient levels x are defined within a range of levels $[0, 2^{N-1}]$. In accordance with an alternative embodiment, there may be no upper bound of the interval range. Moreover, FIG. 2 illustrates only positive transform coefficient levels although same may also be signed. Regarding the signs of the transform coefficients 12 and their coding, it should be noted that different possibilities exist with respect to coding these signs, and all of these possibilities shall be within the scope of the embodiments. With regard to FIG. 2, this means that there may also be no lower bound of the range interval of the transform coefficient levels.

In any case, in order to code the transform coefficient levels of the transform coefficients 12, different binarization schemes may be used in order to cover different portions or intervals 16, 18 of the range interval 20. To be more precise, transform coefficient levels within a first level interval 16, except for the ones equal to a maximum level of the first level interval 16, may simply be binarized onto a set of one or more bins in accordance with a first binarization scheme. Transform coefficient levels, however, lying within the second level interval 18, are mapped onto a combination of bin sets of the first and second binarization schemes.

As shown in FIG. 2, the second level interval 18 lies above the first level interval 16 but overlaps with the latter at the maximum level of the first level interval 16, which is 2 in the example of FIG. 2. For transform coefficient levels lying within the second level interval 18, the respective level is mapped onto a combination of the first bin set corresponding to the first level interval's maximum level in accordance with the first binarization scheme, and a second bin set depending on a position of the transform coefficient level within the second level interval 18 in accordance with the second binarization scheme.

In other words, the first symbolization scheme 16 maps the levels covered by the first level interval 16 onto a set of first bin sequences. Please note that the length of the bin sequences within the set of bin sequences of the first binarization scheme may even be merely one binary symbol in case of the first level interval 16 merely covering two transform coefficient levels such as 0 and 1. In accordance with an embodiment of the present application, the first binarization scheme is a truncated unary binarization of levels in interval 16.

The second binarization scheme maps the levels within the second level interval 18 onto a set of second bin sequences of varying length. In particular, the second binarization scheme may map the levels within interval 18, i.e. x—the maximum level of the first interval, onto a a binary unary binarization or a truncated unary binarization using MPS and LPS as the alphabet.

The bin strings of the latter binarization may then be coded in accordance with any of the above embodiments.

As shown in FIG. 3, transform coefficients typically show a certain statistics or probability of occurrence of certain transform coefficient levels. FIG. 3 shows a graph associating to each possible transform coefficient level x a probability at which the respective transform coefficient level is actually assumed by a transform coefficient in question. To be more precise, FIG. 3 shows two such associations or probability curves, namely for two coefficients of different contexts. That is, FIG. 3 assumes the transform coefficients to be differentiated according to their contexts such as determined by the transform coefficient values of neighboring transform coefficients. Depending on the context, FIG. 3 shows that the probability curve which associates a probability value with each transform coefficient level may depend on the context of the transform coefficient in question.

In accordance with an embodiment, the bins of the bin sequences of the first binarization scheme 16 are entropy coded in a context adaptive way. That is, a context is associated with the bins, and the alphabet probability distribution associated with the selected context is used for entropy coding the respective bin. The bins of the bin sequences of the second symbolization scheme, i.e MPS or LPS, are inserted into the data stream according to the above embodiments.

By this measure, contexts used in entropy coding the symbols of the first binarization scheme may be selected appropriately so as to allow for a good adaptation of the estimated binary probability distribution to the actual alphabet (bin) statistics. That is, the entropy coding scheme may be configured to update a current estimate of the context's alphabet probability distribution whenever a bin having this context is encoded/decoded, thereby approximating the actual bin statistics. The approximation is faster if the contexts are chosen appropriately, that is fine enough, but not with too many different contexts so as to avoid a too infrequent association of bins with certain contexts. The context could be determined based on previously coded/decoded transform coefficients (may be merely as contained within interval 16) in a neighborhood template 22 an example of which is shown in FIG. 1.

Likewise, in order to approximate the actual alphabet statistics within the second interval as close as possible, in the above embodiments, $R_{LPS}$, i.e., s, (and optionally, u and/or Rthr) may be set accordingly. For example, same may be varied or determined from the context, i.e. from the values of neighboring transform coefficient levels. The determination should closely correspond to the correlation of the dependency of the probability curve within the second interval 18 on the previously coded/decoded coefficients such as ones in the template 22 or some other template collecting neighboring transform coefficient positions.

That is, in applying the above embodiments for arithmetic coding onto the coding of transform coefficients according to FIGS. 1 to 3, the encoder could be configured to in one or more separate scans—one for the first bin of all coefficients, one for the second bin of all coefficients greater than zero, and one for the third bin of all coefficients greater than one, for example—along scan path 14, context-adaptively binary arithmetically code the bins of the first binarization of x or k (whatever is smaller) where k may be 2; in doing so, the context may be derived from the neighborhood, i.e. from coefficient levels or first binarization bins of neighboring coefficient positions 22 already coded; context adaptivity may involve updating a probability estimate for $R_{LPS}$ used in arithmetic coding based on the already coded bins of the same context; different contexts may be used for transform block of different sizes and for different areas of the same transform block; and in a separate scan—for all coefficients greater than or equal to k—along scan path 14, binary arithmetically code x minus k in accordance with the above embodiments.

In applying the above embodiments for arithmetic coding onto the coding of transform coefficients according to FIGS. 1 to 3, the decoder could be configured to in one or more separate scans—one for the first bin of all coefficients, one for the second bin of all coefficients greater than zero, and one for the third bin of all coefficients greater than one, for example—along scan path 14, context-adaptively binary arithmetically decode the bins of the first binarization of x or k (whatever is smaller) where k may be 2; in doing so, the context may be derived from the neighborhood, i.e. from coefficient levels or first binarization bins of neighboring coefficient positions 22 as already coded; context adaptivity may involve updating a probability estimate for $R_{LPS}$ used in arithmetic coding based on the already coded bins of the same context; different contexts may be used for transform block of different sizes and for different areas of the same transform block; and in a separate scan—for all coefficients greater than or equal to k—along scan path 14, binary arithmetically decode x minus k in accordance with the above embodiments, thereby obtaining c, with reconstructing x as c plus k.

The scan directions, i.e. from DC to maximum frequency and vice versa, may change from scan to scan.

The first binarization could alternatively by skipped. Then, the coefficient levels would be used as c directly, and coded/decoded using above embodiments.

Naturally, the above coded non-negative integer values could be extended by a sign flag so as to achieve, together, a coding of a representation of general integer values by coding both, the non-negative value in the way described above along with the corresponding sign flag which may be coded separately or in the arithmetic coding scheme.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein.

The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A binary arithmetic decoder for decoding a non-negative integer value from a bitstream, the binary arithmetic decoder being configured to use a binary unary representation of the non-negative integer value, which maps the non-negative integer value c onto a binary symbol sequence comprising a number of MPS's equal to the non-negative integer value, a current state of the binary arithmetic decoder being defined by a current interval defined by an interval width R, and a value V from the interior of the current interval, the binary arithmetic decoder being configured to decode the number of MPS's of the non-negative integer value iteratively using an iteration comprising determining a maximum number $c_{max}$ of MPS that can be decoded until an LPS occurs with using $2^s$ as a partial interval width $R_{LPS}$ corresponding to an LPS, by measuring a difference of R and V with $2^s$;

determining a maximum number $c_{mps}$ of MPS that can be decoded until a renormalization occurs with using $2^s$ as the partial interval width $R_{LPS}$ corresponding to the LPS, by measuring a difference of R and $R_{min}$ with $2^s$, with $R_{min}$ denoting a minimum allowed value for R and being a power of 2;

if $c_{max}$ is greater zero and $c_{max}$ is greater than $c_{mps}$, reducing R by $c_{mps}$ times $2^s$, thereby decoding $c_{mps}$ of the MPS's of c;

performing a renormalization by comprising increasing R using a renormalization factor being a predetermined power of 2, reading a bit from the bitstream, and increasing V using the renormalization factor and subsequently adding the value of bit;

if $c_{max}$ is greater zero and $c_{max}$ is smaller than $c_{mps}$, reducing R by $c_{max}$ times $2^s$, thereby decoding $c_{max}$ of the MPS's of c, wherein the binary arithmetic decoder is configured such that the binary symbol sequence comprises a number of MPS's equal to the non-negative integer value, followed by an LPS, wherein the binary arithmetic decoder is further configured to decode the LPS of the non-negative integer value by determining a renormalization number based on a difference of log 2 ($R_{min}$) and s;

updating V using a difference of V and a partial interval width $R_{MPS}$ corresponding to an MPS, multiplied with 2 to the power of the renormalization number;

reading the renormalization number of bits from the bitstream and adding same to V;

setting R to be $R_{min}$ or a predetermined function of $R_{min}$.

2. The binary arithmetic decoder according to claim 1, wherein the binary arithmetic decoder is configured such that the iteration comprises if $c_{max}$ is greater zero and $c_{max}$ is equal to $c_{mps}$, reducing R by $c_{max}$ times $2^s$, thereby decoding $c_{mps}$ of the MPS's of c.

3. The binary arithmetic decoder according to claim 1, wherein the binary arithmetic decoder is configured to, in iteratively decoding the number of MPS's of the non-negative integer value, cycle the iteration until all c MPS's of the non-negative integer value have been decoded.

4. The binary arithmetic decoder according to claim 1, further configured to initialize c with zero before the iterative decoding and increase c by $c_{mps}$ if $c_{max}$ is greater zero and $c_{max}$ is greater than $c_{mps}$ and increase c by $c_{max}$ if $c_{max}$ is greater zero and $c_{max}$ is smaller than $c_{mps}$ in the iterative decoding.

5. The binary arithmetic decoder according to claim 1, wherein the binary arithmetic decoder is configured such that the binary symbol sequence comprises the number of MPS's equal to the non-negative integer value, followed by the LPS if c is smaller than a maximum value $c_m$, and not followed by an LPS if c is equal to the maximum value $c_m$, wherein the binary arithmetic decoder is further configured to, in determining the maximum number $c_{max}$, limit $c_{max}$ to get not greater than $c_m - c$.

6. The binary arithmetic decoder according to claim 1, wherein the binary arithmetic decoder is configured to determine the renormalization number to be $1+\log_2(R_{min})-s$ and to set R to be $2*(R_{min}-1)$.

7. The binary arithmetic decoder according claim 1, wherein the binary arithmetic decoder is configured to determine the renormalization number to be $\log_2(R_{min})-s$ and to set R to be $R_{min}$.

8. The binary arithmetic decoder according to claim 1, wherein the binary arithmetic decoder is configured to, in updating V using a difference of V and a partial interval width $R_{MPS}$ corresponding to an MPS, multiplied with 2 to the power of the renormalization number, perform a left shift of V-$R_{MPS}$ by the renormalization number of bit positions.

9. The binary arithmetic decoder according to claim 1, wherein the binary arithmetic decoder is configured to change s between consecutive iterations.

10. The binary arithmetic decoder according to claim 1, wherein the binary arithmetic decoder is configured to reduce s in a predetermined manner at an $u_{th}$ performance of the renormalization.

11. The binary arithmetic decoder according to claim 1, wherein the binary arithmetic decoder is configured to reduce s in a predetermined manner at an $u_{th}$ performance of the renormalization, provided s has not yet reached a minimum value $s_{min}$.

12. The binary arithmetic decoder according to claim 10, wherein the binary arithmetic decoder is configured to initially increase $u_{th}$ by 1 in case of R being smaller than a threshold Rthr.

13. The binary arithmetic decoder according to claim 1, wherein s is between 3 and 7, both inclusively, and $R_{min}$ is between 128 and 512, both inclusively.

14. A binary arithmetic encoder for encoding a non-negative integer value into a bitstream, the binary arithmetic encoder being configured to use a binary unary representation of the non-negative integer value, which maps the non-negative integer value c onto a binary symbol sequence comprising a number of MPS's equal to the non-negative integer value, a current state of the binary arithmetic encoder being defined by a current interval defined by an interval width R and an interval offset L, the binary arithmetic encoder being configured to encode the number of MPS's of the non-negative integer value iteratively using an iteration comprising determining a maximum number $c_{mps}$ of MPS that can be encoded until a renormalization occurs with using $2^s$ as a partial interval width $R_{LPS}$ corresponding to an LPS, by measuring a difference of R and $R_{min}$ with $2^s$, with $R_{min}$ denoting a minimum allowed value for R and being a power of 2;

if c is greater than $c_{mps}$,
reducing R by $c_{mps}$ times $2^s$, thereby coding $c_{mps}$ of the MPS's of c;
performing a renormalization by comprising increasing R and L using a renormalization factor being a predetermined power of 2, respectively, and writing a bit to the bitstream;

if c is smaller than $c_{mps}$,
reducing R by c times $2^s$, thereby coding all c MPS's of c, wherein the binary arithmetic encoder is configured such that the binary symbol sequence comprises a number of MPS's equal to the non-negative integer value, followed by an LPS, wherein the binary arithmetic encoder is further configured to encode the LPS of the non-negative integer value by
determining a renormalization number based on a difference of $\log_2(R_{min})$ and s;
updating L using a sum of L and a partial interval width $R_{MPS}$ corresponding to an MPS, multiplied with 2 to the power of the renormalization number;
writing the renormalization number of bits to the bitstream;
setting R to be $R_{min}$ or a predetermined function of $R_{min}$.

15. The binary arithmetic encoder according to claim 14, wherein the binary arithmetic encoder is configured such that the iteration comprises if c is equal to $c_{mps}$,
reducing R by $c_m$ times $2^s$, thereby coding $c_{mps}$ of the MPS's of c; and
performing a renormalization by comprising increasing R and L using a renormalization factor being a predetermined power of 2, respectively, and writing a bit to the bitstream.

16. The binary arithmetic encoder according to claim 14, wherein the binary arithmetic encoder is configured to, in iteratively encoding the number of MPS's of the non-negative integer value, cycle the iteration until all c MPS's of the non-negative integer value have been encoded.

17. The binary arithmetic encoder according to claim 14, further configured to initialize c to equal the non-negative integer value before the iterative encoding and decrease c by $c_{mps}$ if c is greater than $c_{mps}$.

18. The binary arithmetic encoder according to claim 14, wherein the binary arithmetic encoder is configured such that the binary symbol sequence comprises the number of MPS's equal to the non-negative integer value, followed by the LPS if c is smaller than a maximum value $c_m$, and not followed by an LPS if c is equal to the maximum value $c_m$.

19. The binary arithmetic encoder according to claim 14, wherein the binary arithmetic encoder is configured to determine the renormalization number to be $1+\log_2(R_{min})-s$ and to set R to be $2*(R_{min}-1)$.

20. The binary arithmetic encoder according to claim 14, wherein the binary arithmetic encoder is configured to determine the renormalization number to be $\log_2(R_{min})-s$ and to set R to be $R_{min}$.

21. The binary arithmetic encoder according to claim 14, wherein the binary arithmetic encoder is configured to, in updating L using a sum of L and a partial interval width $R_{MPS}$ corresponding to an MPS, multiplied with 2 to the power of the renormalization number, perform a left shift of $L+R_{MPS}$ by the renormalization number of bit positions.

22. The binary arithmetic encoder according to claim 14, wherein the binary arithmetic encoder is configured to change s between consecutive iterations.

23. The binary arithmetic encoder according to claim 14, wherein the binary arithmetic encoder is configured to reduce s in a predetermined manner at an $u_{th}$ performance of the renormalization.

24. The binary arithmetic encoder according to claim 14, wherein the binary arithmetic encoder is configured to reduce s in a predetermined manner at an $u_{th}$ performance of the renormalization, provided s has not yet reached a minimum value $s_{min}$.

25. The binary arithmetic encoder according to claim 23, wherein the binary arithmetic encoder is configured to initially increase $u_{th}$ by 1 in case of R being smaller than a threshold Rthr.

26. The binary arithmetic encoder according to claim 14, wherein s is between 3 and 7, both inclusively, and $R_{min}$ is between 128 and 512, both inclusively.

27. The binary arithmetic encoder according to claim 14, wherein the the binary arithmetic encoder is configured to binarize the non-negative integer value using the binary unary binarization.

28. A method for binary arithmetic decoding a non-negative integer value from a bitstream, the method using a binary unary representation of the non-negative integer value, which maps the non-negative integer value c onto a binary symbol sequence comprising a number of MPS's equal to the non-negative integer value, a current state of the method being defined by a current interval defined by an interval width R, and a value V from the interior of the current interval, the method comprising decoding the number of MPS's of the non-negative integer value iteratively using an iteration comprising determining a maximum number $c_{max}$ of MPS that can be decoded until an LPS occurs with using $2^s$ as a partial interval width $R_{LPS}$ corresponding to an LPS, by measuring a difference of R and V with $2^s$;

determining a maximum number $c_{mps}$ of MPS that can be decoded until a renormalization occurs with using $2^s$ as the partial interval width $R_{LPS}$ corresponding to the LPS, by measuring a difference of R and $R_{min}$ with $2^s$, with $R_{min}$ denoting a minimum allowed value for R and being a power of 2;

if $c_{max}$ is greater zero and $c_{max}$ is greater than $c_{mps}$, reducing R by $c_{mps}$ times $2^s$, thereby decoding $c_{mps}$ of the MPS's of c;

performing a renormalization by comprising increasing R using a renormalization factor being a predetermined power of 2, reading a bit from the bitstream, and increasing V using the renormalization factor and subsequently adding the value of bit;

if $c_{max}$ is greater zero and $c_{max}$ is smaller than $c_{mps}$, reducing R by $c_{max}$ times $2^s$, thereby decoding $c_{max}$ of the MPS's of c, wherein the binary symbol sequence comprises a number of MPS's equal to the non-negative integer value, followed by an LPS, wherein the method further comprises decoding the LPS of the non-negative integer value by determining a renormalization number based on a difference of $\log 2(R_{min})$ and s;

updating V using a difference of V and a partial interval width $R_{MPS}$ corresponding to an MPS, multiplied with 2 to the power of the renormalization number;

reading the renormalization number of bits from the bitstream and adding same to V;

setting R to be $R_{min}$ or a predetermined function of $R_{min}$.

29. A method for binary arithmetic encoding a non-negative integer value into a bitstream, the method using a binary unary representation of the non-negative integer value, which maps the non-negative integer value c onto a binary symbol sequence comprising a number of MPS's equal to the non-negative integer value, a current state of the method being defined by a current interval defined by an interval width R and an interval offset L, the method comprising encoding the number of MPS's of the non-negative integer value iteratively using an iteration comprising determining a maximum number $c_{mps}$ of MPS that can be encoded until a renormalization occurs with using $2^s$ as a partial interval width $R_{LPS}$ corresponding to an LPS, by measuring a difference of R and $R_{min}$ with $2^s$, with $R_{min}$ denoting a minimum allowed value for R and being a power of 2;

if c is greater than $c_{mps}$, reducing R by $c_{mps}$ times $2^s$, thereby coding $c_{mps}$ of the MPS's of c;

performing a renormalization by comprising increasing R and L using a renormalization factor being a predetermined power of 2, respectively, and writing a bit to the bitstream;

if c is smaller than $c_{mps}$, reducing R by c times $2^s$, thereby coding all c MPS's of c, wherein the binary symbol sequence comprises a number of MPS's equal to the non-negative integer value, followed by an LPS, wherein the method further comprises encoding the LPS of the non-negative integer value by determining a renormalization number based on a difference of $\log_2(R_{min})$ and s;

updating L using a sum of L and a partial interval width $R_{MPS}$ corresponding to an MPS, multiplied with 2 to the power of the renormalization number;

writing the renormalization number of bits to the bitstream;

setting R to be $R_{min}$ or a predetermined function of $R_{min}$.

30. A computer program comprising a program code for performing, when running on a computer, a method according to claim 28.

31. A computer program comprising a program code for performing, when running on a computer, a method according to claim 29.

32. A non-transitory computer readable medium having stored thereon a computer program comprising a program code for performing, when running on a computer, a method according to claim 28.

33. A non-transitory computer readable having stored thereon a computer program comprising a program code for performing, when running on a computer, a method according to claim 29.

34. The binary arithmetic decoder according to claim 1, wherein the binary arithmetic decoder is configured to determine the maximum number $c_{max}$ according to $c_{max}=(R-1-V)>>s$.

35. The binary arithmetic decoder according to claim 1, wherein the binary arithmetic decoder is configured to determine the maximum number $c_{mps}$ according to $c_{mps}=1+((R-R_{min})>>s)$.

36. The binary arithmetic decoder according to claim 1, wherein the binary arithmetic decoder is configured to determine the maximum number $c_{max}$ according to $c_{max}=(R-1-V)>>s$ and determine the maximum number $c_{mps}$ according to $c_{mps}=1+((R-R_{min})>>s)$.

* * * * *